US008949632B2

(12) United States Patent
Kobayashi et al.

(10) Patent No.: US 8,949,632 B2
(45) Date of Patent: Feb. 3, 2015

(54) POWER CONTROL APPARATUS FOR CONTROLLING POWER ACCORDING TO CHANGE AMOUNT OF THERMAL FLUID ANALYSIS IN POWER CONSUMPTION FOR COOLING SERVERS IN SERVER ROOM

(75) Inventors: Hiroki Kobayashi, Kawasaki (JP); Yuichi Sato, Yamato (JP); Sachio Kobayashi, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 275 days.

(21) Appl. No.: 13/562,466

(22) Filed: Jul. 31, 2012

(65) Prior Publication Data

US 2013/0081048 A1 Mar. 28, 2013

(30) Foreign Application Priority Data

Sep. 27, 2011 (JP) ................. 2011-211632

(51) Int. Cl.
| | | |
|---|---|---|
| G06F 1/26 | (2006.01) | |
| G05D 23/00 | (2006.01) | |
| G05D 23/19 | (2006.01) | |
| G05B 13/04 | (2006.01) | |
| G06F 9/50 | (2006.01) | |
| H05K 7/20 | (2006.01) | |

(52) U.S. Cl.
CPC ............ *G05D 23/00* (2013.01); *G05D 23/1934* (2013.01); *G05B 13/048* (2013.01); *G06F 9/5094* (2013.01); *H05K 7/20836* (2013.01); Y02B 60/142 (2013.01)
USPC .......................................... 713/300; 718/105

(58) Field of Classification Search
CPC ..... G06F 1/206; G06F 1/3206; G06F 9/5094; G05D 23/00
USPC ........................................... 713/300; 718/105
See application file for complete search history.

(56) References Cited

U.S. PATENT DOCUMENTS

| | | | | |
|---|---|---|---|---|
| 6,964,539 | B2 * | 11/2005 | Bradley et al. ................ | 403/300 |
| 8,200,995 | B2 | 6/2012 | Shiga et al. | |
| 8,301,315 | B2 * | 10/2012 | Dawson et al. ............... | 700/300 |
| 8,365,176 | B2 * | 1/2013 | Campbell et al. ............. | 718/102 |
| 8,560,677 | B2 * | 10/2013 | VanGilder et al. ........... | 709/224 |
| 8,631,411 | B1 * | 1/2014 | Ghose ........................... | 718/102 |
| 2007/0180117 | A1 | 8/2007 | Matsumoto et al. | |
| 2007/0260417 | A1 * | 11/2007 | Starmer et al. ................ | 702/136 |
| 2009/0150129 | A1 * | 6/2009 | Archibald et al. ................ | 703/5 |
| 2009/0265568 | A1 * | 10/2009 | Jackson ........................ | 713/320 |
| 2011/0107332 | A1 * | 5/2011 | Bash ................................ | 718/1 |

FOREIGN PATENT DOCUMENTS

| | | |
|---|---|---|
| JP | 2007-179437 A | 7/2007 |
| JP | 2010-015192 A | 1/2010 |

* cited by examiner

*Primary Examiner* — Chun Cao
(74) *Attorney, Agent, or Firm* — Fujitsu Patent Center

(57) ABSTRACT

A power control apparatus includes a processor that causes thermal fluid analysis of the amount of increase in power consumption for cooling a plurality of servers, where the increase in power consumption is consequent to an increase in the volume of tasks at each server among the servers. Based on analysis results obtained by the thermal fluid analysis, the processor selects from among the servers, a server to execute a task and causes the selected server to execute the task.

15 Claims, 10 Drawing Sheets

US 8,949,632 B2

POWER CONTROL APPARATUS FOR CONTROLLING POWER ACCORDING TO CHANGE AMOUNT OF THERMAL FLUID ANALYSIS IN POWER CONSUMPTION FOR COOLING SERVERS IN SERVER ROOM

CROSS REFERENCE TO RELATED APPLICATIONS

This application is based upon and claims the benefit of priority of the prior Japanese Patent Application No. 2011-211632, filed on Sep. 27, 2011, the entire contents of which are incorporated herein by reference.

FIELD

The embodiments discussed herein are related to power consumption control.

BACKGROUND

Conventionally, technology dynamically changes task allocation to software servers such that power consumption at a server room is reduced and according to the operating states of the servers in the server room, changes the settings of cooling apparatuses that cool the servers (see, for example, Japanese Laid-Open Patent Publication Nos. 2010-15192 and 2007-179437).

Nonetheless, with the conventional technology above, a problem arises in that allocation suitable for the current operating states of the server cannot be performed because task allocation to software servers is changed based on an existing database. Furthermore, since the setting of the cooling apparatuses is based on an existing database, the settings cannot be changed suitably for the current operating states of the servers.

SUMMARY

According to an aspect of an embodiment, a power control apparatus includes a processor that causes thermal fluid analysis of the amount of increase in power consumption for cooling a plurality of servers, where the increase in power consumption is consequent to an increase in the volume of tasks at each server among the servers. Based on analysis results obtained by the thermal fluid analysis, the processor selects from among the servers, a server to execute a task and causes the selected server to execute the task.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments of a power control apparatus, a power control method, and a power control program will be explained with reference to the accompanying drawings. The power control apparatus allocates tasks to servers in a server room. The power control apparatus executes allocation reflecting the current operating states of the servers and reduces power consumption at the server room. To this end, the power control apparatus calculates the increased amount of power consumed by cooling apparatuses consequent to an increase in the tasks to be executed by the servers. The power control apparatus allocates a large portion of the tasks to servers having relatively lower increases in cooling apparatus power consumption than other servers.

For example, if a new task arises, the power control apparatus allocates the new task to a server having a relatively lower increase in cooling apparatus power consumption than other servers and causes the server to execute the task. If a task is under execution by a server, the power control apparatus reallocates and transfers the task to a server having a relatively lower increase in cooling apparatus power consumption than the server currently executing the task. Thus, the power control apparatus can reduce power consumption.

The power control apparatus further changes the settings of cooling apparatuses that cool the servers. The power control apparatus changes the settings of the cooling apparatuses, reflecting the current operating states of the servers and lowers the power consumption at the server room. To this end, the power control apparatus calculates the amount of change in a cooling value (e.g., the flow rate of a cooling medium supplied to the cooling apparatuses, temperature, etc.) for each server consequent to cooling apparatus setting changes. The power control apparatus changes the settings such that the cooling value for each server becomes greater than or equal to a target cooling value.

For example, if the cooling values of the servers are less than target cooling values, the power control apparatus changes the settings to increase the cooling performance of the cooling apparatuses such that increases in power consumption are minimized and thus, can reduce power consumption. If the cooling values of the servers are greater than the target cooling values, the power control apparatus changes the settings to reduce the cooling performance of cooling apparatuses and thus, can reduce power consumption.

Figure 1:
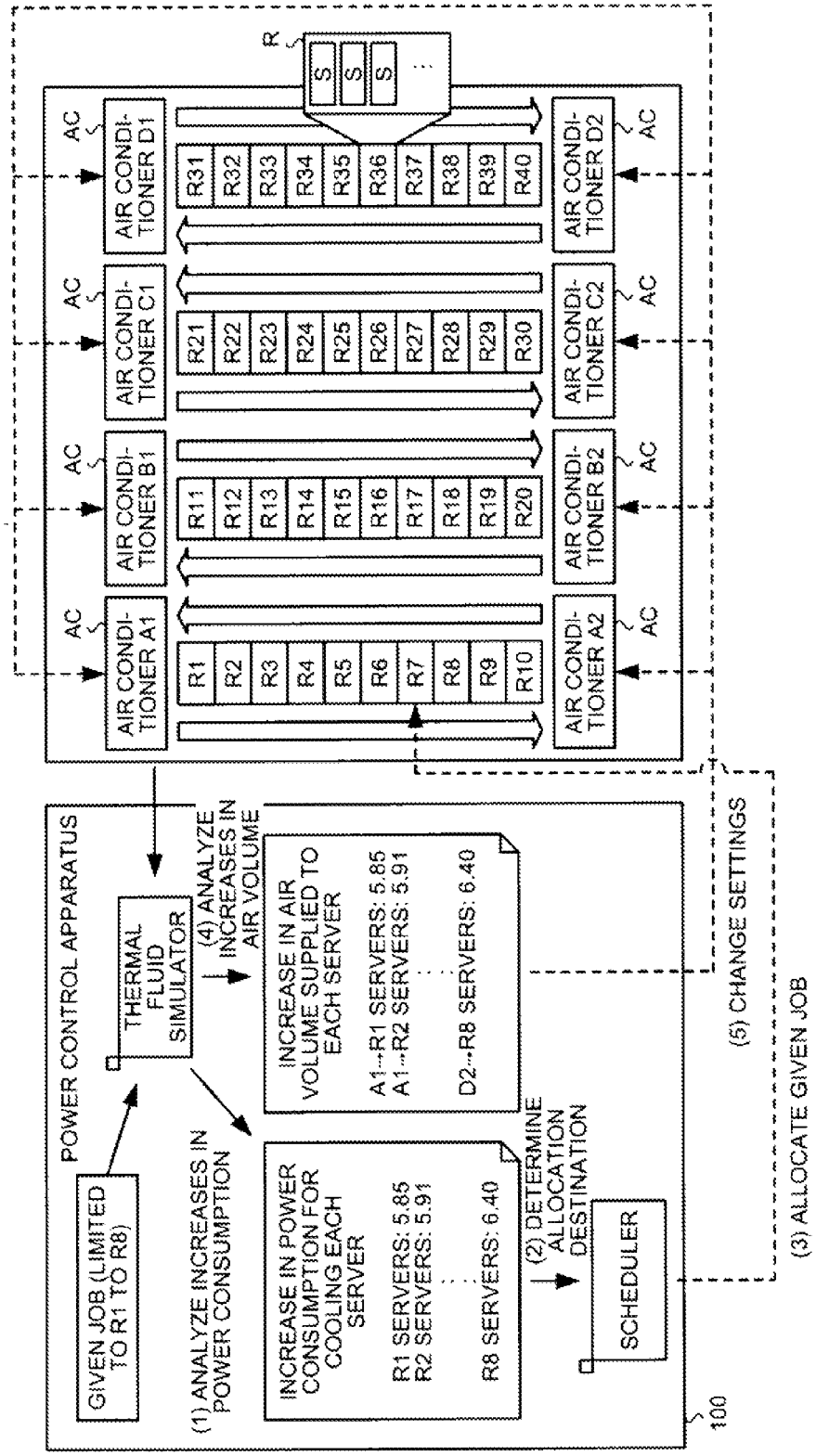
FIG. 1 is a diagram depicting power control by a power control apparatus.

With reference to FIG. 1, power control by the power control apparatus will be described.

FIG. 1 is a diagram depicting power control by the power control apparatus. In FIG. 1, a power control apparatus 100 allocates jobs to servers S in server racks R1 to R40 in a server room. The power control apparatus 100 changes the settings of computer room air conditioners AC (CRAC) that cool the servers S in the server racks R1 to R40 in the server room. In FIG. 1, as the air conditioners AC, 8 air conditioners A1 to D2 are depicted.

Hereinafter, a case will be given where at the power control apparatus 100, a given job that is to be allocated to the servers S arises and allocation of the given job to the servers S by the power control apparatus 100 will be described. Setting changes of the air conditioners AC by the power control apparatus 100 after allocation of the given job to the server S will be described. Hereinafter, although processing is performed according to server rack R, processing may be performed according to server S in the server racks R.

(1) The power control apparatus 100, when a given job arises, identifies servers S that satisfy execution conditions of the given job. The power control apparatus 100 causes a thermal fluid simulator to analyze the increases in power consumption for cooling the identified servers S when the given job is executed by the identified servers S.

In this example, the given job is a job that can be executed by the servers S in the server racks R1 to R8. Therefore, the power control apparatus 100 identifies the servers S in the server racks R1 to R8 as servers S that satisfy the execution conditions of the given job. The power control apparatus 100 causes the thermal fluid simulator to analyze the increases in power consumption for cooling the identified servers S when the given job is executed by the identified servers S.

(2) The power control apparatus 100 determines the servers S having the smallest increase in power consumption to be allocated the given job. In this example, the power control apparatus 100 determines the servers S in the server rack R7 to be allocated the given job.

(3) The power control apparatus 100 allocates the given job to the determined servers S and causes the servers S to execute the given job. Thus, the power control apparatus 100 can minimize increases in power consumption by the air conditioners AC consequent to the execution of the given job.

(4) The power control apparatus 100, after execution of the given job, causes the thermal fluid simulator to analyze the increase in air volume supplied to the servers S when an air volume setting value at the air conditioners AC is increased.

(5) The power control apparatus 100, based on the amount of increase of the air volume supplied to the analyzed servers S, changes the settings of the air conditioners AC such that the air volume supplied to the servers S is greater than or equal to a target air volume for each of the servers S and the power consumption of the air conditioners AC is minimized. Consequently, the power control apparatus 100 can supply an air volume that is greater than or equal to the target air volume of each of the servers S and minimize power consumption.

The power control apparatus 100, as a given job to be allocated, may adopt a job under execution at a server S and transfer the job to a server S for which the increase in power consumption by the air conditioners AC is less than that of the server S currently executing the job and reduce the power consumption of the air conditioners AC.

When the execution of a job at the servers S has ended, the power control apparatus 100 may reduce the power consumption of the air conditioners AC by changing the settings of the air conditioners AC such that the air volume supplied to the servers S is greater than or equal to the target air volumes of the servers S and the power consumption of the air conditioners AC is minimized.

When servers S that are not executing jobs arise as a result of transferring a job under execution at the servers S, the power control apparatus 100 may reduce the power consumption of the servers S by suspending the supply of power to the non-executing servers S. When, servers S that are not executing jobs arise as a result of completion of the execution of the job by the servers, the power control apparatus 100 may reduce the power consumption of the servers S by suspending the supply of power to the non-executing servers S.

The power control apparatus 100 may suppress increases in power consumption by adopting as servers S to which a given job is to be allocated, servers that are executing another job, so as to not increase the number of servers S executing jobs. The power control apparatus 100 may suppress increases in power consumption by adopting as servers S to which a given job is to be allocated, servers S that are adjacent to servers S that are executing another job, so as to bunch the servers S executing jobs.

Figure 2:
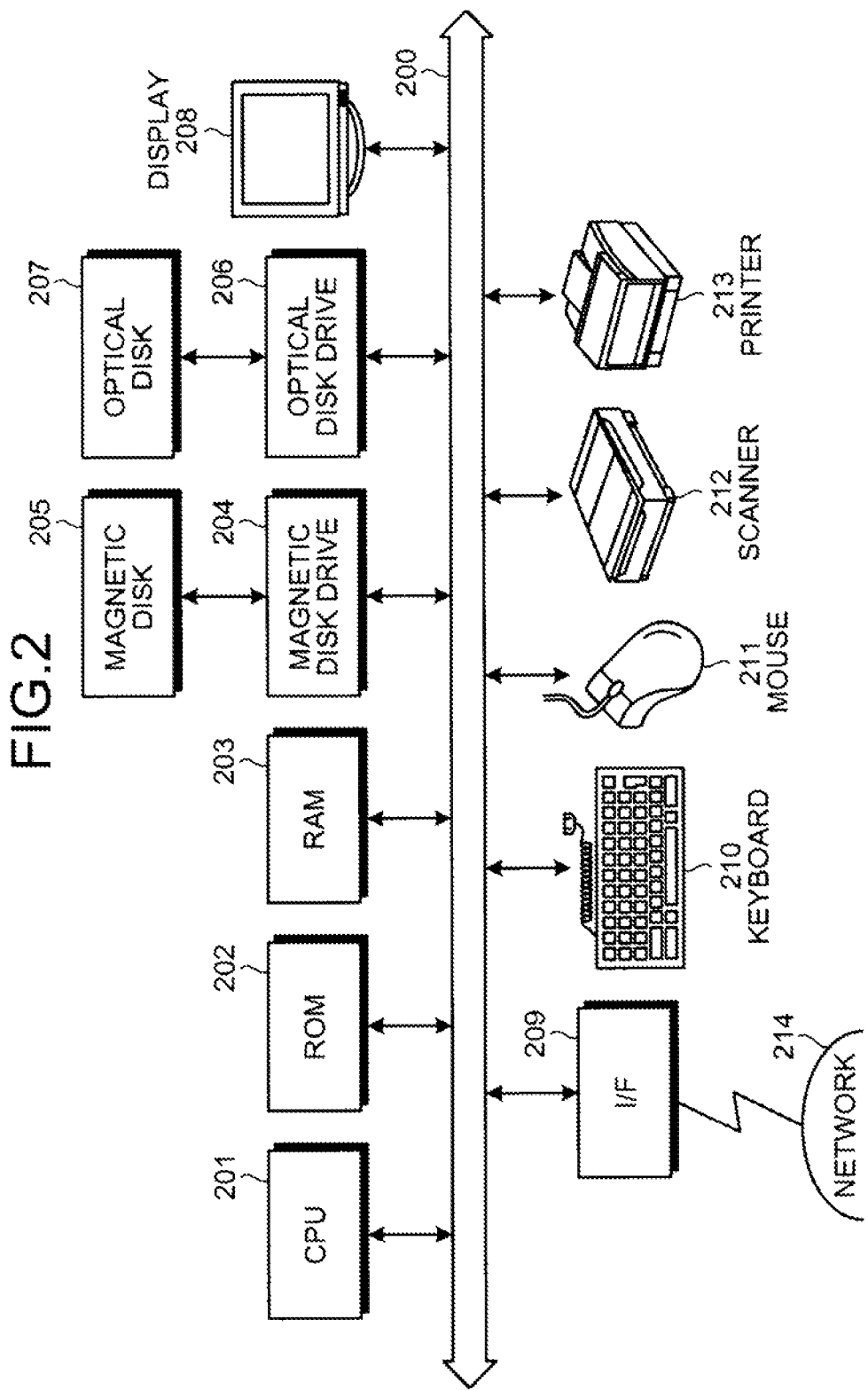
FIG. 2 is a block diagram of an example of a hardware configuration of the power control apparatus according to an embodiment.

FIG. 2 is a block diagram of an example of a hardware configuration of the power control apparatus 100 according to the embodiment. In FIG. 2, the power control apparatus 100 includes a central processing unit (CPU) 201, a read-only memory (ROM) 202, a random access memory (RAM) 203, a magnetic disk drive 204, a magnetic disk 205, an optical disk drive 206, an optical disk 207, a display 208, an interface (I/F) 209, a keyboard 210, a mouse 211, a scanner 212, and a printer 213, respectively connected by a bus 200.

The CPU 201 governs overall control of the power control apparatus 100. The ROM 202 stores therein programs such as a boot program. The RAM 203 is used as a work area of the CPU 201. The magnetic disk drive 204, under the control of the CPU 201, controls the reading and writing of data with respect to the magnetic disk 205. The magnetic disk 205 stores therein data written under control of the magnetic disk drive 204.

The optical disk drive 206, under the control of the CPU 201, controls the reading and writing of data with respect to the optical disk 207. The optical disk 207 stores therein data written under control of the optical disk drive 206, the data being read by a computer.

The display 208 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 208.

The I/F 209 is connected to a network 214 such as a local area network (LAN), a wide area network (WAN), and the Internet through a communication line and is connected to other apparatuses through the network 214. The I/F 209 administers an internal interface with the network 214 and controls the input/output of data from/to external apparatuses. For example, a modem or a LAN adaptor may be employed as the I/F 209.

The keyboard 210 includes, for example, keys for inputting letters, numerals, and various instructions and performs the input of data. Alternatively, a touch-panel-type input pad or numeric keypad, etc. may be adopted. The mouse 211 is used to move the cursor, select a region, or move and change the size of windows. A track ball or a joy stick may be adopted provided each respectively has a function similar to a pointing device.

The scanner 212 optically reads an image and takes in the image data into the design support apparatus. The scanner 212 may have an optical character reader (OCR) function as well. The printer 213 prints image data and text data. The printer 213 may be, for example, a laser printer or an ink jet printer.

Figure 3:
FIG. 3 is a diagram depicting an example of the contents of a power response table.

With reference to FIG. 3, the contents of a power response table will be described. The power response table is stored, for example, in the RAM 203.

FIG. 3 is a diagram depicting an example of the contents of a power response table. As depicted in FIG. 3, a power response table 300 has an air conditioner field and a total field corresponding to each rack field, forming records according to server rack R. Although in this example, the power response table 300 is configured by records according to server rack R, the power response table 300 may be configured by records according to server S.

The rack fields indicate identifiers of the server racks R in the server room. The air conditioner fields indicate the amount of increase in the power consumption of the air conditioners AC when software is executed by the server rack R indicated in the corresponding rack field. Each air conditioner field is divided into an A1 subfield, an A2 subfield, a B1 subfield, a B2 subfield, a C1 subfield, a C2 subfield, a D1 subfield, and a D2 subfield. The total fields indicate the total power consumption of the air conditioners, for each server rack R.

Each A1 subfield of the air conditioner fields indicates the amount of increase in the power consumption of the air conditioner A1 (depicted in FIG. 1) when software is executed by the server rack R indicated in the corresponding rack field. Each A2 subfield of the air conditioner fields indicates the amount of increase in the power consumption of the air conditioner A1 (depicted in FIG. 1) when software is executed by the server rack R indicated in the corresponding rack field. Each B1 subfield of the air conditioner fields indicates the amount of increase in the power consumption of the air conditioner B1 (indicated in FIG. 1) when software is executed by the server rack R indicated in the corresponding rack field. Each B2 subfield of the air conditioner fields indicates the amount of increase in the power consumption of the air conditioner B2 (indicated in FIG. 1) when software is executed by the server rack R indicated in the corresponding rack field.

Each C1 subfield of the air conditioner fields indicates the amount of increase in the power consumption of the air conditioner C1 (indicated in FIG. 1) when software is executed by the server rack R indicated in the corresponding rack field. Each C2 subfield of the air conditioner fields indicates the amount of increase in the power consumption of the air conditioner C2 (indicated in FIG. 1) when software is executed by the server rack R indicated in the corresponding rack field. Each D1 subfield of the air conditioner fields indicates the amount of increase in the power consumption of the air conditioner D1 (indicated in FIG. 1) when software is executed by the server rack R indicated in the corresponding rack field. Each D2 subfield of the air conditioner fields indicates the amount of increase in the power consumption of the air conditioner D2 (indicated in FIG. 1) when software is executed by the server rack R indicated in the corresponding rack field.

Figure 4:
FIG. 4 is a diagram depicting an example of the contents of an air volume response table.

With reference to FIG. 4, the contents of a air volume response table will be described. The air volume response table is stored, for example, in the RAM 203.

FIG. 4 is a diagram depicting an example of the contents of an air volume response table. As depicted in FIG. 4, an air volume response table 400 has an air conditioner field correlated with each rack field, forming records according to server rack R. Although in this example, the air volume response table 400 is configured by records according to the server rack R, the air volume response table 400 may be configured by records according to server S.

The rack fields indicate identifiers of the server racks R in the server room. The air conditioner fields indicate the air volume supplied from the air conditioners AC, to the server rack R indicated in the corresponding rack field. Each air conditioner field is divided into an A1 subfield, an A2 subfield, a B1 subfield, a B2 subfield, a C1 subfield, a C2 subfield, a D1 subfield, and D2 subfield.

Each A1 subfield of the air conditioner fields indicates the air volume supplied from the air conditioner A1 (depicted in FIG. 1), to a server rack R. Each A2 subfield of the air conditioner fields indicates the air volume supplied from the air conditioner A2 (depicted in FIG. 1), to a server rack R. Each B1 subfield of the air conditioner fields indicates the air volume supplied from the air conditioner B1 (depicted in FIG. 1), to a server rack R. Each B2 subfield of the air conditioner fields indicates the air volume supplied from the air conditioner B2 (depicted in FIG. 1), to a server rack R.

Each C1 subfield of the air conditioner fields indicates the air volume supplied from the air conditioner C1 (depicted in FIG. 1), to a server rack R. Each C2 subfield of the air conditioner fields indicates the air volume supplied from the air conditioner C2 (depicted in FIG. 1), to a server rack R. Each D1 subfield of the air conditioner fields indicates the air volume supplied from the air conditioner D1 (depicted in FIG. 1), to a server rack R. Each D1 subfield of the air conditioner fields indicates the air volume supplied from the air conditioner D2 (depicted in FIG. 1), to a server rack R.

Figure 5:
FIG. 5 is a diagram depicting an example of the contents of an air volume deficit table.

With reference to FIG. 5, the contents of an air volume deficit table will be described. The air volume deficit table is stored, for example, in the RAM 203.

FIG. 5 is a diagram depicting an example of the contents of an air volume deficit table. As depicted in FIG. 5, an air volume deficit table 500 has an air conditioner field correlated with each rack field, forming records according to server rack R. Although in this example, the air volume deficit table 500 is configured by records according to server rack R, the air volume deficit table 500 may be configured by records according to server S.

The rack fields indicate identifiers of the server racks R in server room. The air conditioner fields indicate an air volume deficit with respect to the target air volume of the air conditioners AC. Each air conditioner field is divided into an A1 subfield, an A2 subfield, a B1 subfield, a B2 subfield, a C1 subfield, a C2 subfield, a D1 subfield, and a D2 subfield.

Each A1 subfield of the air conditioner fields indicates the air volume deficit with respect to the target air volume that is to be supplied from the air conditioner A1 (depicted in FIG. 1, to the servers S. Each A2 subfield of the air conditioner fields indicates the air volume deficit with respect to the target air volume that is to be supplied from the air conditioner A2 (depicted in FIG. 1, to the servers S. Each B1 subfield of the air conditioner fields indicates the air volume deficit with respect to the target air volume that is to be supplied from the air conditioner B1 (depicted in FIG. 1, to the servers S. Each B2 subfield of the air conditioner fields indicates the air volume deficit with respect to the target air volume that is to be supplied from the air conditioner B2 (depicted in FIG. 1, to the servers S.

Each C1 subfield of the air conditioner fields indicates the air volume deficit with respect to the target air volume that is to be supplied from the air conditioner C1 (depicted in FIG. 1, to the servers S. Each C2 subfield of the air conditioner fields indicates the air volume deficit with respect to the target air volume that is to be supplied from the air conditioner C2 (depicted in FIG. 1, to the servers S. Each D1 subfield of the air conditioner fields indicates the air volume deficit with respect to the target air volume that is to be supplied from the air conditioner D1 (depicted in FIG. 1, to the servers S. Each D2 subfield of the air conditioner fields indicates the air volume deficit with respect to the target air volume that is to be supplied from the air conditioner D2 (depicted in FIG. 1, to the servers S.

Figure 6:
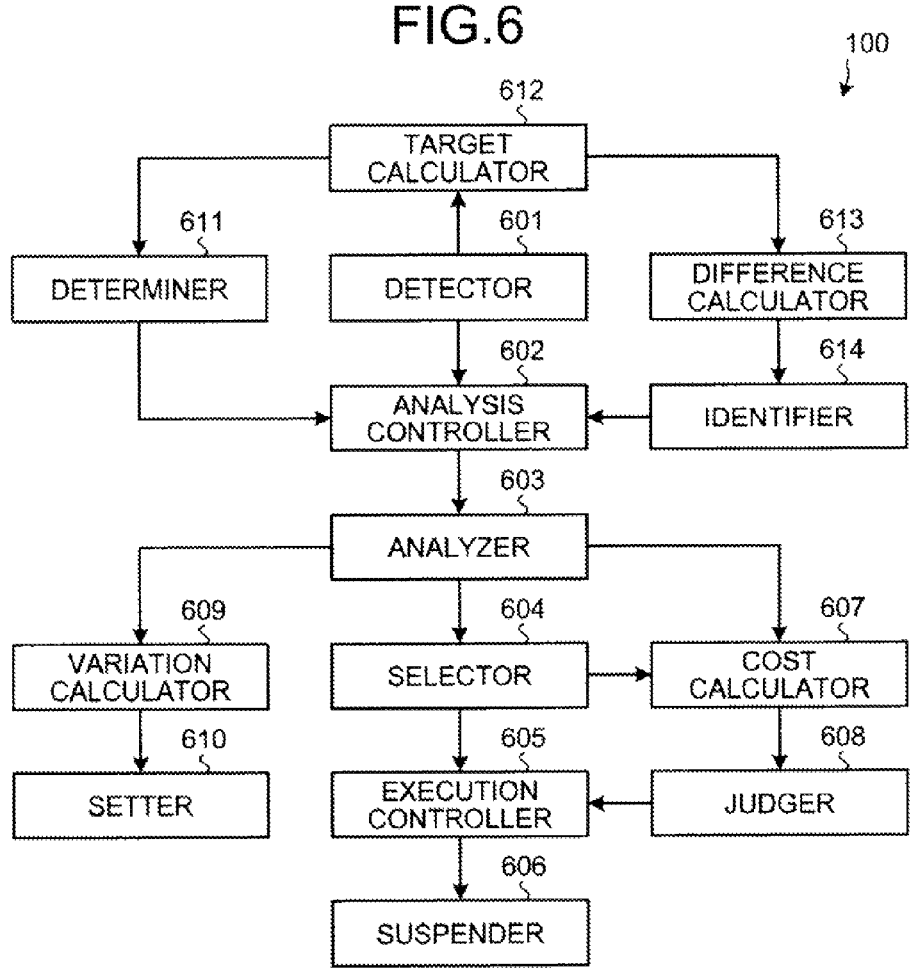
FIG. 6 is a block diagram of a functional configuration of the power control apparatus.

An example of a functional configuration of the power control apparatus 100 will be described. FIG. 6 is a block diagram of a functional configuration of the power control apparatus 100. The power control apparatus 100 includes a detector 601, an analysis controller 602, an analyzer 603, a selector 604, an execution controller 605, a suspender 606, a cost calculator 607, a judger 608, a variation calculator 609, a setter 610, a determiner 611, a target calculator 612, a difference calculator 613, and an identifier 614. These functions (the detector 601 to the identifier 614) forming a controller, for example, are implemented by executing on the CPU 201, a program stored in a storage device such as the ROM 202, the RAM 203, the magnetic disk 205, and the optical disk 207 depicted in FIG. 2, or via the I/F 209.

The detector 601 has a function of detecting a task that is to be allocated to servers S. In this example, as a task to be allocated to the servers S, for example, a virtual machine (VM) or a job can be adopted. For example, the detector 601 detects, as a task to be allocated to the servers S, a job that has been obtained from a job queue by the power control apparatus 100 and that is to be newly executed. Further for example, the detector 601 detects, as a task that is to be allocated to other servers, a job that is under execution by given servers S. Thus, the detector 601 can detect tasks to be allocated to servers S or tasks that are to be reallocated among servers S. Detected data is stored to a storage area of the RAM 203, the magnetic disk 205, and the optical disk 207.

The detector 601 has a function of detecting information indicating the amount of heat generated by each exothermic body in an exothermic body set. In this example, an exothermic body is, for example, a server S in the server room. For example, the detector 601 detects information indicating the amount of heat generated by each of the servers S. Further, for instance, the detector 601 detects the number of tasks under execution by each of the servers S. Thus, the detector 601 can detect information used in calculating the amount of heat generated by each of the servers S. Detected data is stored to a storage area of the RAM 203, the magnetic disk 205, and the optical disk 207.

The analysis controller 602 has a function of causing, when tasks are detected by the detector 601, the analyzer 603 to analyze increases in the power consumed for cooling the servers S consequent to increases in tasks at each of the servers S. In this example, the servers S include servers S that satisfy execution conditions of the detected tasks. An execution condition, for example, is an operating system (OS) specified by the OS of a server S. An execution condition may further be a state where the available capacity of the storage area of the server S is greater than or equal to a threshold. The servers S may include any one among servers S executing other tasks and servers S adjacent to the servers S executing other tasks. The power consumed for cooling is, for example, the power consumed by the cooling apparatuses that cool the servers S. Cooling apparatuses (the air conditioners AC) that use air as a cooling medium, for example, can be adopted as the cooling apparatuses. Cooling apparatuses that use fluid as a cooling medium may be adopted as well as cooling apparatuses that use a cooling gas as a cooling medium.

For example, the analysis controller 602 causes the analyzer 603 to analyze increases in power consumption at the cooling apparatuses, the increases in power consumption being consequent to increases in the number of jobs executed by each of the servers S that satisfy the execution conditions of a job detected by the detector 601. Thus, the analysis controller 602 can cause the analyzer 603 to generate information used in selecting the destination of a job to be allocated.

The analysis controller 602 has a function of causing the analyzer 603 to analyze increases in the cooling value for a given exothermic body, the increases being consequent to changes in the setting of the cooling apparatus cooling the given exothermic body. In this example, a given exothermic body is, for example, a given server S subject to cooling. The flow rate of the cooling medium supplied by the cooling apparatus can be adopted as the setting of the cooling apparatus. The temperature of the cooling medium supplied by the cooling apparatus may be adopted as the setting of the cooling apparatus. The cooling medium is, for example, air, fluid, or a cooling gas. The flow rate of the cooling medium supplied to the given exothermic body may be adopted as the cooling value. The temperature of the cooling medium supplied to the given exothermic body may be adopted as the cooling value.

For example, the analysis controller 602 causes the analyzer 603 to analyze the amount of change in the air volume supplied to a given server S, the change in air volume being consequent to a changing of the air volume setting value of the air conditioners AC cooling the given server. Thus, the analysis controller 602 can cause the analyzer 603 to generate information used in changing the setting of the air conditioners AC.

The analysis controller 602 has a function of causing the analyzer 603 to analyze the amount of change in the cooling value for each given exothermic body, when the respective cooling values of the given exothermic bodies have been determined by the determiner 611 to be greater than target cooling values, the change in the cooling values being consequent to a changing of the settings of the cooling apparatuses cooling an exothermic body set that includes the given exothermic bodies. In this example, the exothermic body set is, for example, the servers S, which include the given servers S subject to cooling.

For example, when the current flow rates supplied to given servers S has been determined by the determiner 611 to be greater than target air volumes, the analysis controller 602 causes the analyzer 603 to analyze the amount of change in the flow rate supplied to each of the servers S, the change in flow rate being consequent to a changing of the air volume setting values of the air conditioners AC. Thus, the analysis controller 602 can cause the analyzer 603 to generate information that is used in changing the setting of the air conditioners AC.

The analyzer 603 has a function of executing thermal fluid analysis based on analysis models of the velocity field and the temperature field concerning the servers S. For example, the analyzer 603, based on an analysis model of the velocity field and the temperature field concerning the servers S, analyzes the amount of increased power consumption for cooling the servers S, the increase in power consumption being consequent to increases in the volume of tasks at each of the servers S. Analysis results are stored to the power response table 300. Further, for example, the analyzer 603, based on an analysis model of the velocity field and the temperature field concerning the servers S, analyzes the amount of change in the cooling value for a given exothermic body, the change in cooling value being related to the amount that the settings of the cooling apparatuses are changed. Analysis results are stored to the air volume response table 400.

The analyzer 603 has a function of analyzing the velocity field and the temperature field concerning the servers S, by given analysis degrees of freedom. The analyzer 603 has a further function of determining based on analysis results, a curtailing level for curtailing analysis degrees of freedom to be fewer than given analysis degrees of freedom. Further, the analyzer 603 has a function of respectively converting analysis models of the velocity field and the temperature field into degrees of freedom curtailing models, based on the determined curtailing level. The analyzer 603 has a further function of analyzing based on the degrees of freedom curtailing models, the amount of increased power consumption for cooling the servers S, where the increase in power consumption is consequent to increases in the volume of tasks at each of the servers S.

For example, the analyzer 603 uses an existing thermal fluid simulation method of a stationary iteration method, which is high speed lattice method, and solves by the given analysis degrees of freedom, simultaneous equations (incompressible Navier-Stokes equations and thermal advection-diffusion equations). The incompressible Navier-Stokes equations are equations that include 4 terms and the thermal advection-diffusion equations are equations that include 3 terms. In the stationary iteration method, with respect to each of the terms in the incompressible Navier-Stokes equations and the thermal advection-diffusion equation, 7 equations that consider only the effect of each term are created and each of the equations can be solved by stationary calculation.

The analyzer 603, based on analysis results obtained by the stationary iteration method, quickly calculates by stationary calculation, the degrees of freedom curtailing models of the velocity field and the temperature field, and for which analysis degrees of freedom have been curtailed. The analyzer 603, based on the degrees of freedom curtailing models, analyzes the amount of increased power consumption for cooling the servers S, the increase in power consumption being consequent to an increase in the volume of tasks at each of the servers S. Thus, the analyzer 603 can quickly execute analysis concerning the servers S. Analysis results are stored to the power response table 300.

The analyzer 603 has a further function of analyzing by the given analysis degrees of freedom, the velocity field and the temperature field concerning a given exothermic body. The analyzer 603 has a function of determining based on analysis results, a curtailing level for curtailing analysis degrees of freedom to be fewer than the given analysis degrees of freedom. The analyzer 603 has a further function of respectively converting analysis models of the velocity field and the temperature field into degrees of freedom curtailing models, based on the determined curtailing level. The analyzer 603 has a function of analyzing based on the degrees of freedom curtailing models, the amount of change in the cooling value for the given exothermic body, with respect to the amount by which a setting value at the cooling apparatus is changed.

For example, the analyzer 603 uses an existing thermal fluid simulation method of a stationary iteration method, which is a high speed lattice method, and solves by the given analysis degrees of freedom, simultaneous equations (incompressible Navier-Stokes equations and thermal advection-diffusion equation). The incompressible Navier-Stokes equations are equations that include 4 terms and the thermal advection-diffusion equations are equations that include 3 terms. In the stationary iteration method, with respect to each of the terms in the incompressible Navier-Stokes equations and the thermal advection-diffusion equation, 7 equations that consider only the effect of each term are created and each of the equations can be solved by stationary calculation.

The analyzer 603, based on analysis results obtained by the stationary iteration method, quickly calculates by stationary calculation, the degrees of freedom curtailing models of the velocity field and the temperature field and for which analysis degrees of freedom have been curtailed. The analyzer 603, based on the degrees of freedom curtailing models, analyzes the amount of change in the cooling value for the given exothermic body, with respect to the amount by which a setting value at the cooling apparatus has been changed. Thus, the analyzer 603 can quickly perform analysis concerning the servers S. Analysis results are stored to the air volume response table 400.

The selector 604 has a function of selecting from among the servers S and based on analysis results obtained by the analyzer 603, a server S to execute a detected task. For example, the selector 604 selects a server S for which the increase in power consumption is least, based on the amount of increase in power consumed for cooling each of the servers S, the increase in power consumption being consequent to increases in tasks at each of the servers S analyzed by the analyzer 603. Thus, the selector 604 can select servers S to which detected tasks are to be allocated and executed by. Selection results are stored to a storage area of the RAM 203, the magnetic disk 205, and the optical disk 207.

The execution controller 605 has a function of causing a server S selected by the selector 604 to execute a detected task. For example, the execution controller 605 transmits an execution request for a job to a server S selected by the selector 604. Thus, the execution controller 605 can allocate a job to a selected server S and cause the selected server S to execute the job.

For example, the execution controller 605 transfers a detected task from a server S currently executing the detected task to a selected server S. Thus, the execution controller 605 can transfer a detected task from one server S to a selected server S and cause the selected server S to execute the task.

The execution controller 605 has a function causing, when transfer cost is judged to be less than power cost by the judger 608, a selected server S to execute a detected task. In this example, transfer cost is the cost incurred by transferring a detected task. Power cost is the cost saved by transferring the detected task. For example, the execution controller 605 transfers a detected task when the server S utilization charge that increases consequent to the transfer to the detected task is judged to be less than saved power charges consequent to the transfer of the detected task. Thus, the execution controller 605 can transfer a detected task when the transfer of the detected task is advantageous from a financial perspective.

The suspender 606 has a function of suspending the supply of power to a server S from which a task has been transferred by the execution controller 605 and that is not executing another task. For example, when a server S (from which a task has been transferred) is not executing another task, the suspender 606 suspends the supply of power to the server S so that power is not consumed while the server S is idle. Thus, the suspender 606 can reduce power consumption at a server S from which a task has been transferred.

The suspender 606 has a function of suspending the supply of power to a server S that is not performing a task. For example, when a server S that is not executing a task is present, the suspender 606 suspends the supply of power thereto. Thus, the suspender 606 can reduce power consumption at a server S from which a task has been transferred.

The cost calculator 607 has a function of calculating based on an estimated transfer time of a detected task and the utilization charge per unit time for a server S, the transfer cost incurred by the transfer of a detected task. For example, the cost calculator 607 multiplies the estimated time consumed for transferring a detected task and the utilization charge per unit time for the server S to calculate the server S utilization charge, which increases consequent to the transfer of the detected task. The calculated transfer cost is stored to a storage area of the RAM 203, the magnetic disk 205, and the optical disk 207.

The cost calculator 607 has function of calculating based on an estimated processing time for a detected task, the amount of power saved per unit time and the power charge per unit time, the power cost saved by the transfer of the detected task. For example, the cost calculator 607 multiplies the estimated time consumed for the detected task to be completed, the amount of power saved per unit time by the transfer of the detected task and the power charge per unit time to calculate the power charge saved by the transfer of a detected task. Thus, the cost calculator 607 can calculate transfer costs and power costs used by the judger 608. The calculated power cost is stored to a storage area of the RAM 203, the magnetic disk 205, and the optical disk 207.

The judger 608 has a function of judging whether the transfer cost calculated by the cost calculator 607 is less than the power cost. For example, the judger 608 judges whether the server S utilization charge, which increases consequent to the transfer of a detected task, is less than the power charge saved by the transfer of the detected task. Thus, the judger 608 can determine whether the transfer of a detected task is advantageous from a financial perspective. Judgment results are stored to a storage area of the RAM 203, the magnetic disk 205, and the optical disk 207.

The variation calculator 609 has a function of calculating based on analysis results obtained by the analyzer 603 and the amount of change when the current cooling value for a given exothermic body is changed to the target cooling value, the amount that a setting value at a cooling apparatus is to be changed. For example, the variation calculator 609 calculates the amount that the air volume setting value at a cooling apparatus is to be changed corresponding to the difference of the target air volume and the current air volume. Thus, the variation calculator 609 can calculate information used in setting a setting value of a cooling apparatus. Calculation results are stored to a storage area of the RAM 203, the magnetic disk 205, and the optical disk 207.

The variation calculator 609 has a function of calculating based on analysis results obtained by the analyzer 603 and the amount of change when the current cooling value for a given exothermic body is changed to the target cooling value, the amount a setting value at a cooling apparatus is to be changed, where the amount is within a range that maintains the cooling value for each exothermic body to be greater than or equal to the target cooling value for the respective exothermic body. For example, the variation calculator 609 calculates the amount that the air volume setting value of a cooling apparatus is to be changed, so that the current air volume at each of the servers is within a range that is greater than or equal to the target air volume. Thus, the variation calculator 609 can calculate information that is used in the setting of setting values at cooling apparatuses. Calculation results are stored to a storage area of the RAM 203, the magnetic disk 205, and the optical disk 207.

The setter 610 has a function of changing the setting value of a cooling apparatus by the amount that is calculated by the variation calculator 609. For example, the setter 610 sets the setting value of a cooling apparatus to a setting value that is the current setting value of the cooling apparatus to which the amount calculated by the variation calculator 609 is added. Thus, the setter 610 can change the setting values of the cooling apparatuses.

The determiner 611 has a function of determining whether the current cooling value for a given exothermic body is greater than a target cooling value. For example, the determiner 611 determines whether the air volume supplied to a server S is greater than the target air volume calculated by the target calculator 612. Thus, the determiner 611 can determine whether the air volume supplied from the air conditioners AC is to be increased. Determination results are stored to a storage area of the RAM 203, the magnetic disk 205, and the optical disk 207.

The target calculator 612 has a function of calculating based on information detected by the detector 601, a target cooling value for each exothermic body. For example, based on the number of tasks that are at a server S and that are detected by the detector 601 and information indicating the target air volume that can cool the heat generated by the detected number of tasks, the target calculator 612 calculates a target air volume for the server S. Thus, the target calculator 612 can calculate target air volumes used in determining whether the air volume of the air conditioners AC is to be increased. The calculated target cooling value is stored to a storage area of the RAM 203, the magnetic disk 205, and the optical disk 207.

The difference calculator 613 has a function of calculating the difference between the target cooling value for a given exothermic body calculated by the target calculator 612 and the current cooling value for the given exothermic body. For example, the difference calculator 613 calculates the difference of the target air volume of a server S and the current supplied air volume. Thus, the difference calculator 613 can calculate information that is used in changing the settings of the air conditioners AC. The calculated difference is stored to the air volume deficit table 500.

The identifier 614 has a function of identifying among the exothermic body set and as a given exothermic body, the exothermic body having the greatest difference calculated by the difference calculator 613. For example, the identifier 614 identifies among the servers S, the server S that has the greatest air volume deficiency with respect to the currently supplied air volume and the target air volume, to be a given server S subject to cooling. Thus, the identifier 614 can identify given servers S to be subject to cooling. Identified servers S are stored to a storage area of the RAM 203, the magnetic disk 205, and the optical disk 207.

Figure 7:
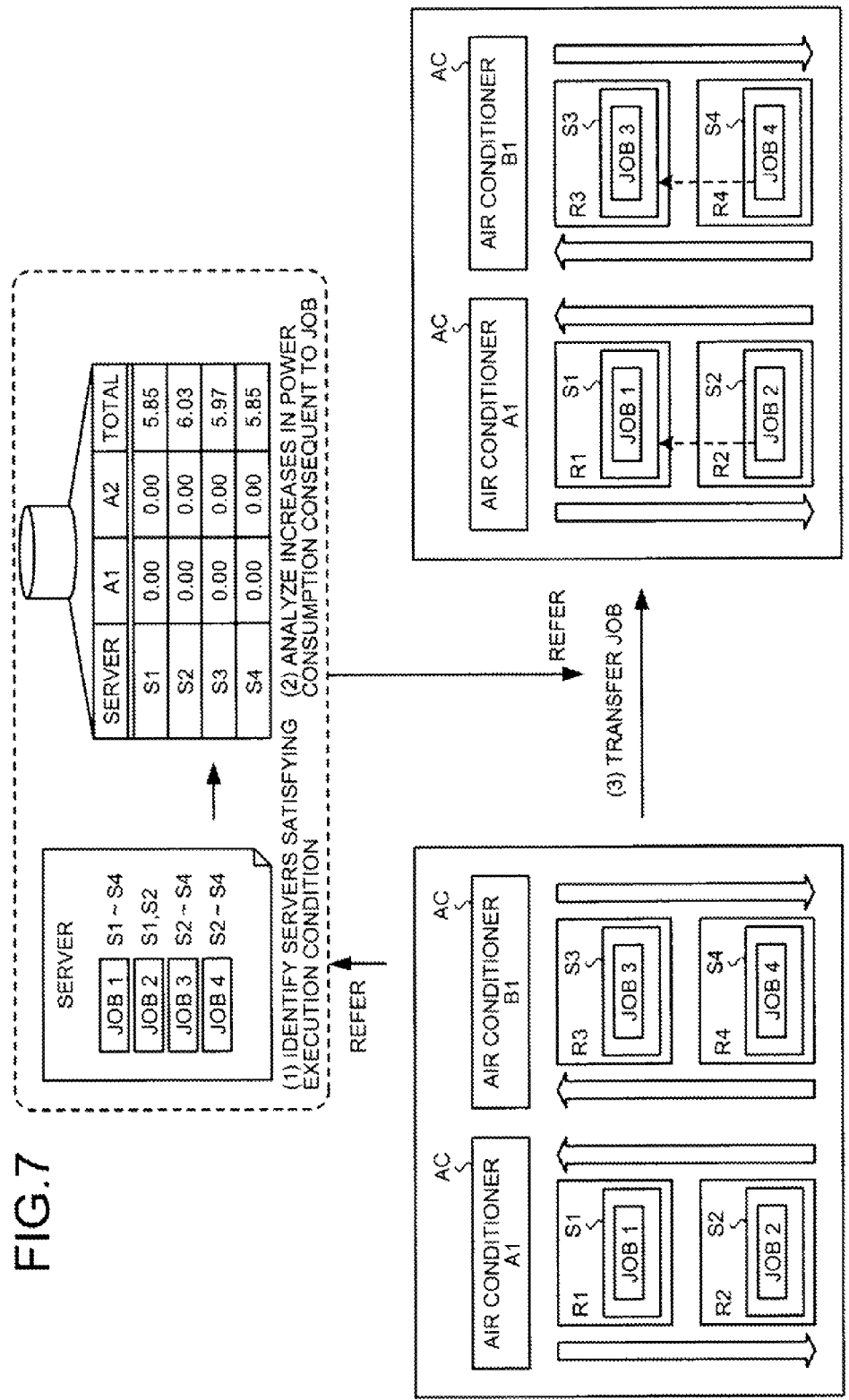
FIGS. 7, 8, and 9 are diagrams depicting an example of power control by the power control apparatus.
Figure 8:
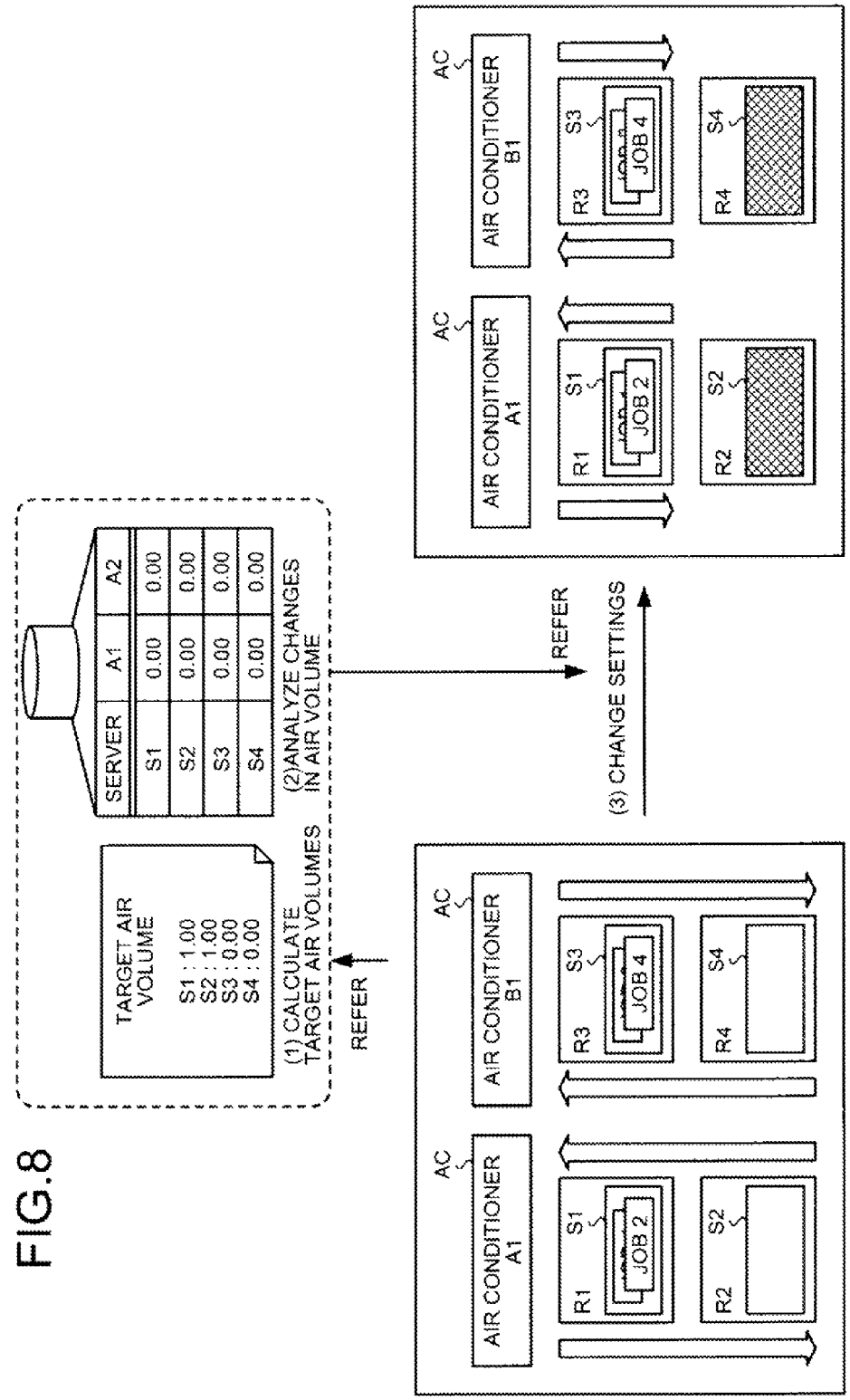
Figure 9:
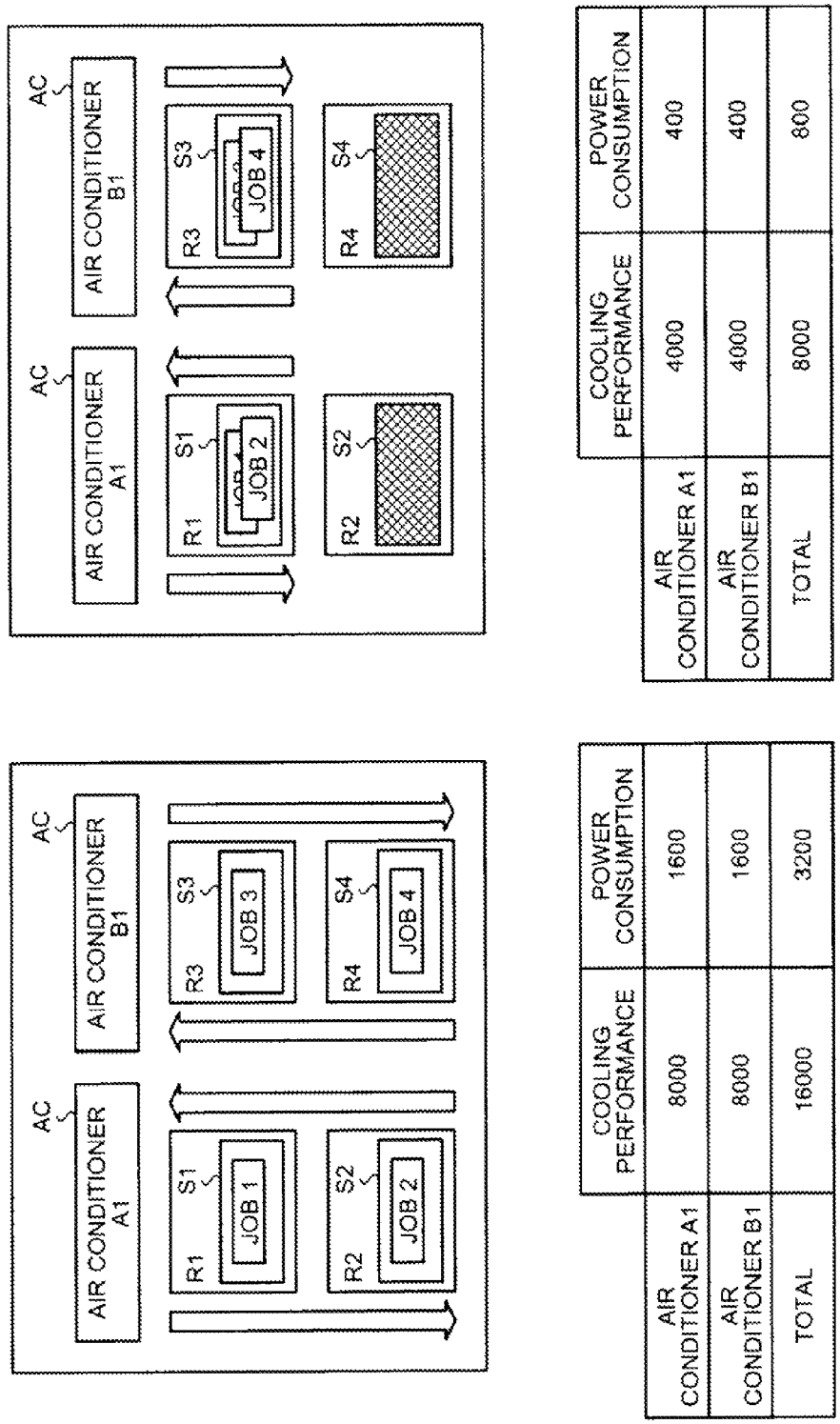

With reference to FIGS. 7, 8, and 9, examples of power control by the power control apparatus 100 will be described.

FIGS. 7, 8, and 9 are diagrams depicting an example of power control by the power control apparatus 100. In FIG. 7, the power control apparatus 100 allocates a job to the servers S housed in the server racks R1 to R4 located in the server room. The power control apparatus 100 changes the settings of the air conditioners AC (CRAC) that cool the servers S in the server racks R1 to R4. The server rack R1 houses the server S1; the server rack R2 houses the server S2; the server rack R3 houses the server S3; and the server rack R4 houses the server S4.

Hereinafter, a case where the power control apparatus 100 allocates jobs under execution at the servers S will be given as an example and the transfer of jobs under execution at servers S to other servers S by the power control apparatus 100 will be described. The changing of the setting of the air conditioners AC by the power control apparatus 100 after the transfer of jobs will be described.

In FIG. 7, (1) the power control apparatus 100 identifies servers S that satisfy execution conditions of the jobs under execution. In this example, the servers S1 to S4 are identified as servers S that satisfy the execution conditions of job 1. The servers S1 and S2 are identified as servers S that satisfy the execution conditions of job 2. The servers S2 to S4 are identified as servers S that satisfy the execution conditions of job 3. The servers S2 to S4 are identified as servers S that satisfy the execution conditions of job 4.

(2) The power control apparatus 100 causes the thermal fluid simulator to analyze the amount of increased power consumption for cooling each of the identified servers S when a job is executed at the identified servers S.

(3) If a server S for which the increased power consumption is less than the server S currently executing the job is present, the power control apparatus 100 determines the server S for which the increased power consumption is less to be a server S to which the job under execution is to be transferred. In this example, the power control apparatus 100 determines the server S1, for which the increased power consumption is less than that of the server S2, which is currently executing job 2, to be a server S to which job 2 is to be transferred. The power control apparatus 100 determines the server S3, for which the increase power consumption is less than that for the server S4, which is currently executing job 4, to be a server S to which job 4 is to be transferred.

The power control apparatus 100 transfers job 2 from the server S2 to the server S1; and transfers job 4 from the server S4 to the server S3. Here, the power control apparatus 100 may transfer jobs to servers S that are near the air conditioners AC and have favorable cooling efficiency to reduce power consumption. The power control apparatus 100 may transfer jobs so that the jobs are executed by the fewest number of servers S to reduce power consumption.

In FIG. 8, (1) the power control apparatus 100, after transferring the jobs, calculates a target air volume to be supplied to each of the servers S. For example, the power control apparatus 100 refers to a table indicating correspondences between server S execution job counts and target air volumes to calculate a target air volume for each of the servers S.

(2) The power control apparatus 100 causes the thermal fluid simulator to analyze the amount of change in the air volume supplied to each of the servers S when the air volume setting values at the air conditioners AC have been changed.

(3) The power control apparatus 100, based on the amount that the air volume has increased, changes the settings of the air conditioners AC such that the air volume supplied to each of the servers S is greater than or equal to the target air volume and the power consumption is minimized. Thus, the power control apparatus 100 supplies air volumes that are greater than or equal to the target air volumes of the servers S and can minimize power consumption. The power control apparatus 100 further reduces power consumption by suspending the supply of power to servers (S2 and S4) that are not executing jobs.

As depicted in FIG. 9, before the transfer of jobs by the power control apparatus 100, the power consumption of the air conditioners AC is 3200 [W]. On the other hand, after the transfer of jobs by the power control apparatus 100, since fewer servers S are executing jobs, even if the cooling performance of the air conditioners AC decreases, the servers S can be sufficiently cooled. In this example, setting changes to decrease the cooling performance of the air conditioners AC are performed and the power consumption of the air conditioners AC becomes 800 [W]. Thus, the power control apparatus 100 can change the settings of the air conditioners AC and reduce power consumption.

Since idle servers S consume power, collectively executing jobs by fewer servers S consumes less total power by the servers S than by distributing and executing the jobs among numerous servers S. In this example, the power control apparatus 100 collectively executes the jobs by the server S1 and S; and suspends the supply of power to the server S2 and S4, which are not executing jobs. Consequently, the power control apparatus 100 can reduce power consumption compared to that before transferring the jobs.

Figure 10:
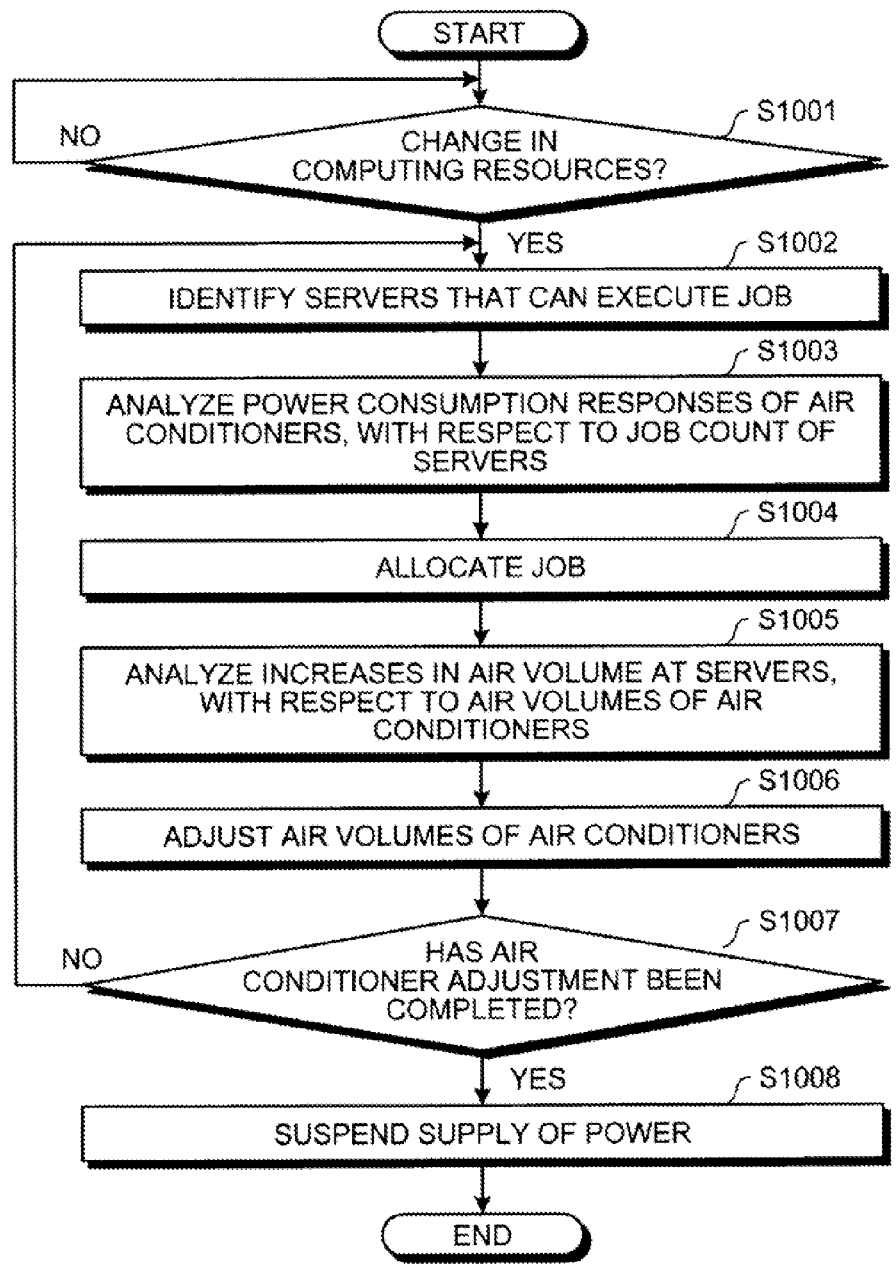
FIG. 10 is a flowchart of power consumption control processing.

With reference to FIG. 10, power consumption control processing will be described.

FIG. 10 is a flowchart of power consumption control processing. The CPU 201 judges whether there is a change in computing resources (step S1001). If there is no change in computing resources (step S1001: NO), the CPU 201 returns to step S1001 and awaits a change in computing resources.

If there is a change in computing resources (step S1001: YES), the CPU 201 identifies servers S that can execute the given job to be allocated (step S1002). The CPU 201 analyzes the power consumption responses of the air conditions AC with respect to the job count of each of the servers S (step S1003).

The CPU 201, based on the analyzed power consumption responses of the air conditions AC, allocates the given job to servers S for which increases in power consumption by the air conditioners AC is least and causes the servers S to execute the given job (step S1004). The CPU 201 analyzes increases in the air volumes at each of the servers S, with respect to the air volumes of the air conditioners AC (step S1005). The CPU 201, based on the analyzed increases in air volume at the servers S, adjusts the air volumes of the air conditioners AC (step S1006).

The CPU 201 judges whether adjustment of the air conditioners AC has been completed (step S1007). If the adjustment has not been completed (step S1007: NO), the CPU 201 returns to step S1002.

If the adjustment has been completed (step S1007: YES), the CPU 201 suspends the supply of power to servers S that are not executing jobs (step S1008), and ends the power consumption control processing. Thus, the power control apparatus 100 can reduce the power consumption at the server room. Although in this example, a change in the computing resources is a trigger for executing the power consumption control processing, the power consumption control processing may be executed at given intervals.

As described, when a task to be newly allocated to the servers S arises, the power control apparatus 100 acquires analysis results concerning the amount of increased power consumption for cooling, the increased power consumption being consequent to increases in the tasks at each of the servers S in a server room. The power control apparatus 100, based on the analysis results, allocates the task to the server S for which the increase in power consumption is least and causes the server S to execute the task. Therefore, the power control apparatus 100 can minimize increases in power consumption consequent to task execution at the servers S.

The power control apparatus 100 acquires analysis results concerning the amount of increased power consumption for cooling, the increased power consumption being consequent to increases in tasks at each of the servers in the server room. The power control apparatus 100, based on the analysis results, transfers tasks from servers currently executing the tasks to servers for which the increase in power consumption is lower. Therefore, the power control apparatus 100 can reduce power consumption consequent to task execution.

The power control apparatus 100 suspends the supply of power to servers S that are not executing jobs. Therefore, the power control apparatus 100 can save the power consumed by idle servers S.

The power control apparatus 100 transfers a task if the increased financial load consequent to terminating execution of the task when the task is to be transferred is less than the financial savings consequent to power savings after the transfer. Therefore, the power control apparatus 100 can transfer tasks when the transfer of the tasks is advantageous from a financial perspective.

The power control apparatus 100 adopts (as a server S to which a task is to be allocated) a server S executing another task or a server S adjacent to a server executing another task. Therefore, the power control apparatus 100 can reduce the power consumption of cooling apparatuses by bunching the servers S that are executing jobs and improving cooling efficiently.

The power control apparatus 100 acquires analysis results concerning the amount of change in the cooling value for a given server subject to cooling, the change in the cooling value being consequent to a changing of a setting of the cooling apparatuses cooling the given server S. The power control apparatus 100, based on the analysis results, changes the setting of cooling apparatuses such that the cooling value for the given server S is greater than or equal to the target cooling value. Therefore, the power control apparatus 100 can set the cooling apparatuses to be able to sufficiently cool the given server S.

When the current cooling value for the given server S is greater than or equal to the target cooling value, the power control apparatus 100 acquires analysis results concerning changes in the cooling value for each server among servers that include the given server S, the changes in the cooling values being consequent to the setting of the cooling apparatuses being changed. The power control apparatus 100, based on the analysis results, changes the settings of the cooling apparatuses to reduce cooling performance, where the settings are changed within a range that maintains the cooling values of the servers S to be greater than or equal to the target cooling value. Therefore, the power control apparatus 100 can sufficiently cool the servers S and reduce power consumption.

The power control method described in the present embodiment may be implemented by executing a prepared program on a computer such as a personal computer and a workstation. The program is stored on a computer-readable medium such as a hard disk, a flexible disk, a CD-ROM, an MO, and a DVD, read out from the computer-readable medium, and executed by the computer. The program may be distributed through a network such as the Internet.

The power control method, which is executed by a computer, includes causing thermal fluid analysis of the amount of change in a cooling value for a given exothermic body, the change in the cooling value being consequent to a changing of a setting value at a cooling apparatus cooling the given exothermic body and the thermal fluid analysis being caused by the computer; calculating the amount that the setting value at the cooling apparatus is to be changed, the computer calculating the amount based on results of the thermal fluid analysis and the amount of change when the current cooling value for the given exothermic body is changed to a target cooling value; and changing the setting value at the cooling apparatus, the computer changing the setting value by the calculated amount that the setting value is to be changed.

A computer-readable recording medium has stored therein a program for causing a computer to execute a power control process that includes causing thermal fluid analysis of the amount of increase in power consumption for cooling multiple servers, the increase in power consumption being consequent to an increase in the volume of tasks at each server among the servers and the thermal fluid analysis being caused by the computer; selecting from among the servers, a server to execute a task, the computer selecting the server based on results of the thermal fluid analysis; and causing, by the computer, the selected server to execute the task.

A computer-readable recording medium has stored therein a program for causing a computer to execute a power control process that includes causing thermal fluid analysis of the amount of change in a cooling value for a given exothermic body, the change in the cooling value being consequent to a changing of a setting value at a cooling apparatus cooling the given exothermic body and the thermal fluid analysis being caused by the computer; calculating the amount that the setting value at the cooling apparatus is to be changed, the computer calculating the amount based on results of the thermal fluid analysis and the amount of change when the current cooling value for the given exothermic body is changed to a target cooling value; and changing the setting value at the cooling apparatus, the computer changing the setting value by the calculated amount that the setting value is to be changed.

In the power control system, a power control apparatus and an analyzer that executes thermal fluid analysis communicate. The power control system includes the analyzer that analyzes respectively, by given analysis degrees of freedom, a velocity field and a temperature field concerning a plurality of servers; determines a curtailing level for curtailing analysis degrees of freedom to be fewer than the given analysis degrees of freedom; converts respectively analysis models of the velocity field and the temperature field into degrees of freedom curtailing models, based on the determined curtailing level; and analyzes based on the degrees of freedom curtailing models, the amount of increase in power consumption for cooling the servers, the increase in power consumption being consequent to increases in the volume of tasks at each of the servers; and the power control apparatus that causes the analyzer to analyze the amount of increase in power consumption for cooling the servers, the increase in power consumption being consequent to increases in the volume of tasks at each of the servers; selects from among the servers and based on analysis results obtained by the analyzer, a server to execute a task, and causes the selected server to execute to the task.

In the power control system, a power control apparatus and an analyzer that executes thermal fluid analysis communicate. The power control system includes the analyzer that analyzes respectively, by given analysis degrees of freedom, a velocity field and a temperature field concerning a given exothermic body; determines a curtailing level for curtailing analysis degrees of freedom to be fewer than the given analysis degrees of freedom; converts respectively analysis models of the velocity field and the temperature field into degrees of freedom curtailing models, based on the determined curtailing level, and analyzes the amount of increase in a cooling value for the given exothermic body based on the degrees of freedom curtailing models, the increase in the cooling value being consequent to a changing of a setting value at a cooling apparatus cooling the given exothermic body; and the power control apparatus that causes the analyzer to analyze the amount of change in the cooling value for the given exothermic body, the change in the cooling value being consequent to a changing of the setting value at the cooling apparatus; calculates based on analysis results and the amount of change when the current cooling value for the given exothermic body is changed to a target cooling value, the amount that the setting value at the cooling apparatus is to be changed; and changes the setting value of the cooling apparatus by the calculated amount that the setting value is to be changed.

According to one aspect of the embodiments, the current operating states of servers can be reflected to suppress increases in power consumption.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power control apparatus comprising
a processor that:
- causes thermal fluid analysis of an amount of increase in power consumption for cooling a plurality of servers, the increase in power consumption being consequent to an increase in the volume of tasks at each server among the servers,
- based on analysis results obtained by the thermal fluid analysis, selects from among the servers, a server to execute a task,
- causes the selected server to execute the task,
- causes thermal fluid analysis of an amount of change in a cooling value for a given server, the change in the cooling value being consequent to a change in a setting value at a cooling apparatus cooling the given server among the servers,
- calculates an amount that the setting value at the cooling apparatus is to be changed, based on results of the thermal fluid analysis and an amount of change when the current cooling value for the given server is changed to a target cooling value,
- changes the setting value of the cooling apparatus by the calculated amount that the setting value is to be changed,
- determines whether the current cooling value for the given server is greater than the target cooling value,
- upon determining the current cooling value to be greater than the target cooling value, causes thermal fluid analysis of an amount of change in the cooling value for each server among the servers that include the given server, the change in the cooling value being consequent to a change in the setting value at the cooling apparatus cooling the servers, and
- calculates an amount that the setting value at the cooling apparatus is to be changed, based on results of the thermal fluid analysis and an amount of change when the current cooling value for the given server is changed to the target cooling value, the amount that the setting value is to be changed being within a range that maintains the cooling value for each server to be greater than or equal to the target cooling value for the server.

2. The power control apparatus according to claim 1, wherein the processor causes the task to be transferred from a source server currently executing the task to the selected server.

3. The power control apparatus according to claim 2, wherein the processor suspends power supply to the source server, when the task has been transferred and the source server is not executing another task.

4. The power control apparatus according to claim 2, wherein the processor:
- calculates based on an estimated transfer time of the task and a utilization charge per unit time for the server, transfer cost incurred by transferring the task,
- calculates based on an estimated processing time for the task, the amount of power saved per unit time and a power charge per unit time, power cost saved by a transfer of the task,
- judges whether the calculated transfer cost is less than the calculated power cost, and
- causes the selected server to execute the task upon judging the transfer cost to be less than the power cost saved.

5. The power control apparatus according to claim 1, wherein the servers include any one among a server executing another task and a server adjacent to a server executing another task.

6. The power control apparatus according to claim 1, wherein the processor causes thermal fluid analysis of the amount of change in the cooling value for the given server, the change in the cooling value corresponding to the amount that a flow rate setting of a cooling medium is changed at the cooling apparatus.

7. The power control apparatus according to claim 1, wherein the processor causes thermal fluid analysis of the amount of change in the cooling value for the given server, the change in the cooling value corresponding to the amount that a temperature setting of a cooling medium is changed at the cooling apparatus.

8. The power control apparatus according to claim 1, wherein the processor causes thermal fluid analysis of the amount of change in the cooling value for the given server, the change in the cooling value corresponding to the amount that a flow rate setting and a temperature setting of a cooling medium is changed at the cooling apparatus.

9. The power control apparatus according to claim 1, wherein the processor:
- detects information indicating the amount of heat generated by each server among the servers,
- calculates the target cooling value for each server, based on the detected information,
- calculates for each server, the difference of the calculated target cooling value and the current cooling value, and
- identifies among the servers and as the given server, a server having the greatest calculated difference.

10. A power control apparatus comprising a processor that:
- causes thermal fluid analysis of an amount of change in a cooling value for a given exothermic body, the change in the cooling value being consequent to a change in a setting value at a cooling apparatus cooling the given exothermic body,
- calculates an amount that the setting value at the cooling apparatus is to be changed, based on results of the thermal fluid analysis and an amount of change when the current cooling value for the given exothermic body is changed to a target cooling value,
- changes the setting value of the cooling apparatus by the calculated amount that the setting value is to be changed,
- determines whether the current cooling value of the given exothermic body is greater than the target cooling value,
- upon determining the current cooling value to be greater than the target cooling value, causes thermal fluid analysis of an amount of change in the cooling value for each exothermic body among an exothermic body set that includes the given exothermic body, the change in the cooling value being consequent to a change in the setting value at the cooling apparatus cooling the given exothermic body, and
- calculates an amount that the setting value at the cooling apparatus is to be changed, based on results of the thermal fluid analysis and an amount of change when the current cooling value of the given exothermic body is changed to the target cooling value, the amount that the setting value is to be changed being within a range that maintains the cooling value for each exothermic body to be greater than or equal to the target cooling value for the exothermic body.

11. The power control apparatus according to claim 10, wherein the processor causes thermal fluid analysis of the amount of change in the cooling value for the given exothermic body, the change in the cooling value corresponding to the amount that a flow rate setting of a cooling medium is changed at the cooling apparatus.

12. The power control apparatus according to claim 10, wherein the processor causes thermal fluid analysis of the amount of change in the cooling value for the given exothermic body, the change in the cooling value corresponding to the amount that that a temperature setting of a cooling medium is changed at the cooling apparatus.

13. The power control apparatus according to claim 10, wherein the processor causes thermal fluid analysis of the amount of change in the cooling value for the given exothermic body, the change in the cooling value corresponding to the amount that a flow rate setting and a temperature setting of a cooling medium is changed at the cooling apparatus.

14. The power control apparatus according to claim 10, wherein the processor:
- detects information indicating the amount of heat generated by each exothermic body among an exothermic body set,
- calculates the target cooling value for each exothermic body, based on the detected information,
- calculates for each exothermic body, the difference of the calculated target cooling value and the current cooling value, and
- identifies among the exothermic body set and as the given exothermic body, an exothermic body having the greatest calculated difference.

15. A power control method executed by a computer, the method comprising:
- causing thermal fluid analysis of an amount of increase in power consumption for cooling a plurality of servers, the increase in power consumption being consequent to an increase in the volume of tasks at each server among the servers and the thermal fluid analysis being caused by the computer;
- selecting from among the servers, a server to execute a task, the computer selecting the server based on results of the thermal fluid analysis;
- causing, by the computer, the selected server to execute the task,
- causing thermal fluid analysis of an amount of change in a cooling value for a given server, the change in the cooling value being consequent to a change in a setting value at a cooling apparatus cooling the given server among the servers,
- calculating an amount that the setting value at the cooling apparatus is to be changed, based on results of the thermal fluid analysis and an amount of change when the current cooling value for the given server is changed to a target cooling value,
- changing the setting value of the cooling apparatus by the calculated amount that the setting value is to be changed,
- determining whether the current cooling value for the given server is greater than the target cooling value,
- upon determining the current cooling value to be greater than the target cooling value, causing thermal fluid analysis of an amount of change in the cooling value for each server among the servers that include the given server, the change in the cooling value being consequent to a change in the setting value at the cooling apparatus cooling the servers, and
- calculating an amount that the setting value at the cooling apparatus is to be changed, based on results of the thermal fluid analysis and an amount of change when the current cooling value for the given server is changed to the target cooling value, the amount that the setting value is to be changed being within a range that maintains the cooling value for each server to be greater than or equal to the target cooling value for the server.

* * * * *